METHOD FOR MAKING ELECTRICALLY CONDUCTING LAYER OF COPPER IODIDE

Filed Oct. 22, 1968 2 Sheets-Sheet 1

INVENTORS
YOSHIKI HAYASHI
HIROMI SASAKI
TOICHI MATSUMURA

BY Wenderoth, Lind & Ponack
ATTORNEYS

INVENTORS
YOSHIKI HAYASHI
HIROMI SASAKI
TOICHI MATSUMURA

BY Wenderoth, Lind & Ponack
ATTORNEYS

United States Patent Office 3,677,816

Patented July 18, 1972

3,677,816

METHOD FOR MAKING ELECTRICALLY CONDUCTIVE LAYER OF COPPER IODIDE

Yoshiki Hayashi, Hiromi Sasaki, and Toichi Matsumura, Osaka, Japan, assignors to Matsushita Electric Industrial Co., Ltd., Osaka, Japan Filed Oct. 22, 1968, Ser. No. 769,680
Claims priority, application Japan, Oct. 26, 1967, 42/70,048
Int. Cl. B44d *1/18*
U.S. Cl. 117—217 5 Claims

ABSTRACT OF THE DISCLOSURE

A transparent and electrically conducting coating is provided on a surface of a solid inert insulating substrate by exposing said surface to an atmosphere of copper metal vapor so as to form a thin layer of copper metal thereon and then contacting the said thin layer of copper metal with an iodine-containing solution so as to convert the thin layer of copper metal into a thin layer of copper iodide. Means for carrying out the method above described are set forth.

This invention relates to a novel method of making electrically conductive copper iodide thin layer superposed on a substrate. The invention also relates to a method for making a transparent film which comprises a transparent substrate having an electrically conducting thin layer of copper iodide superposed thereon. Furthermore this invention relates to a method for making a long flexible and transparent film which comprises a long flexible and transparent substrate having a transparent and electrically conducting copper iodide layer superposed thereon.

It has been eagerly desired to develop substantially flexible and transparent film having an electrically conducting thin layer adhered firmly on a flexible organic polymer substrate. Such a flexible and transparent film may be employed for an electronic image recording medium such as a transparent electrophotographic film which is described in U.S. Pat. 3,168,857, a transparent "Thermoplastic Recording Film" disclosed by W. E. Glenn in Journal of the Society of Motion Picture and Television Engineers, volume 69, p. 577 (1960) and the photoplastic recording described by J. Gaynor et al. in the Journal of Photographic Science and Engineering, volume 7, p. 209 (1963).

The prior art discloses a film having a thin layer of cuprous iodide superposed on a solid inert substrate, said cuprous iodide being formed by exposing a surface of said substrate to an atmosphere of copper vapor and then exposing the resulting copper coated surface to iodine vapor. The use of iodine vapor requires a tightly closed chamber because leaked iodine vapor is extremely toxic to an operator.

The conductive thin layer of cuprous iodide prepared by said vapor method is not sufficiently uniform in composition because of difficult control of the iodine vapor density. In addition, it is not easy for the vapor method to produce an electrically conducting thin layer of cuprous iodide adhered strongly to a substrate.

An object of the present invention is to provide a method for making an electrically conducting thin layer of copper iodide superposed on a substrate without using iodine vapor.

Another object of the present invention is to provide a method for making an electrically conducting thin layer of copper iodide, which is uniform in composition.

A further object of the present invention is to provide a method for making an electrically conducting thin layer of copper iodide adhered strongly to a substrate.

A further object of the present invention is to provide a method for making a flexible and transparent film having an electrically conducting thin layer of copper iodide adhered strongly to a flexible and transparent substrate.

A further object of the present invention is to provide a method for making a film having an electrically conducting thin layer of copper iodide adhered strongly to a substrate and a resinous topcoat superposed on said thin layer of copper iodide.

These and other objects of the invention which will become apparent upon consideration of the following description taken in connection with the drawings, are achieved by the present invention. In the said drawings.

Figure 1:
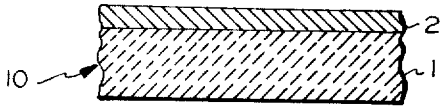
FIG. 1 is a cross-sectional view, on a highly exaggerated scale, of a copper iodide thin layer superposed on a substrate in accordance with the present invention.

According to the present invention, a film having an electrically conducitng thin layer of copper iodide adhered strongly to a surface of solid inert insulating substrate is prepared by a process which comprises the steps of exposing said surface to an atmosphere of copper metal vapor so as to form a thin layer of copper metal on said surface and contacting said thin layer of copper metal with an iodine-containing solution so as to convert said thin layer of copper metal into a thin layer of copper iodide.

Before proceeding with detailed description of a novel method contemplated by the present invention, structures of film prepared by the novel method will be explained with reference to FIG. 1 and FIG. 2.

Reference 10 designates, as a whole, a film having an electrically conducting thin layer of copper iodide 2 adhered strongly to a substrate 1. Reference character 20 designates, as a whole, a film comprising a substrate 1, an electrically conducting thin layer of copper iodide 2 adhered strongly to said substrate 1, and a topcoat 3 superposed on said thin layer of copper iodide.

Said substrate 1 can be made of any solid material inert to the aforesaid iodine-containing solution. Ceramics, glass, and organic polymer materials may be used. The preferable substrate is a thin film of a film-forming polymer such as polyethylene, polypropylene, polyvinyl alcohol, polyvinyl chloride, polycarbonate, polyethylene terephthalate, polystyrene, regenerated cellulose, cellulose acetate, cellulose nitrate or polymethyl methacrylate.

Said substrate 1 is coated with a copper metal thin layer by any available and suitable method. A vacuum evaporation method is preferable because said copper metal thin layer is superposed uniformly on the substrate 1 at room temperature (about 15° to about 30° C.).

In order to make a flexible and transparent film 10 or 20, it is necessary that the thickness of said copper metal thin layer be controlled. It is not easy to measure said thickness directly. The thickness can be evaluated conveniently by a white light transmittance. A thin layer of copper metal superposed on a transparent substrate 1 is prepared by a vacuum evaporation method and is subjected to a white light transmission test which is usually carried out by employing a densitometer for use in photographic densitometery. The white light transmittance of said thin layer of copper metal is calculated by substracting the transmittance of said substrate 1 from the actually observed transmittance of the film consisting of substrate 1 and thin layer of copper metal. According to the inventon, a substantially transparent film 10 is obtained by providing a thin layer of copper metal with the transmittance of 45% to 70%.

Figure 3:
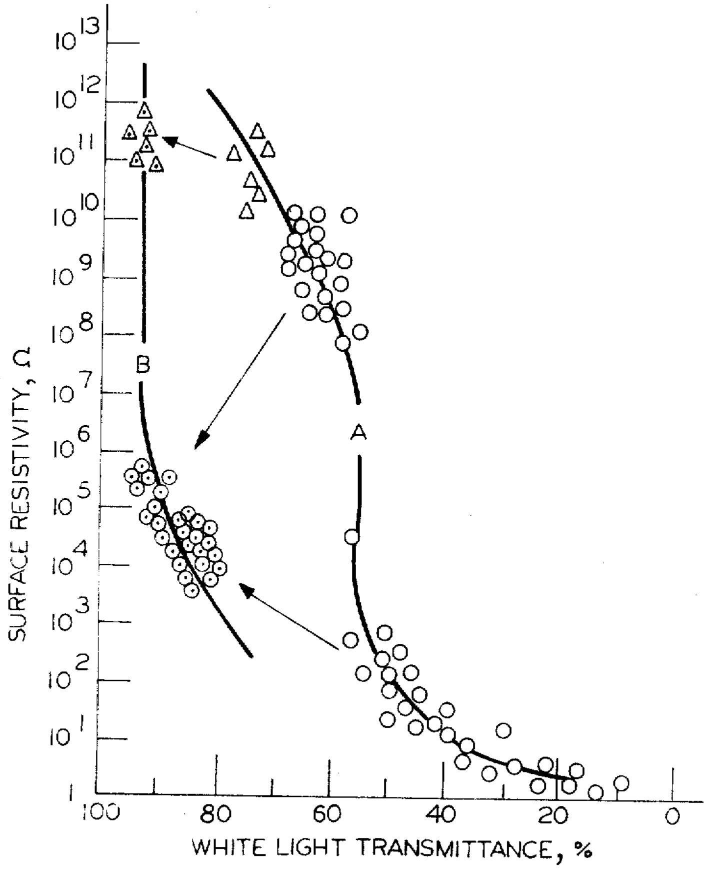
FIG. 3 is a graphical illustration of the surface resistivity of the deposited copper layer (curve A) and the corresponding copper iodide layer (curve B) as a function of white light transmittance.

Referring to FIG. 3, curve A shows the relation between the white light transmittance and the surface resistivity of said thin layer of copper metal. The surface resistivity decreases with a decrease in the transmittance. The surface resistivity of said thin layer of copper metal varies from 1Ω to $10^{11}$Ω with a variation in the transmittance from 10% to 80%.

The thin layer of copper metal superposed on substrate 1 is caused to react with an iodine-containing solution so as to form a thin layer of copper iodide 2 adhered strongly to the substrate 1 in accordance with the invention. A film having a thin layer of copper metal formed thereon is dipped into said iodine-containing solution. The dipping time depends on the thickness of said copper metal layer and the concentration of iodine in said solution. The reaction can be carried out by applying said iodine-dissolved solution to the surface of the thin layer of copper metal by a well-known technique such as spray coating, knife coating, bead coating, roll coating or gravure printing.

Said iodine-containing solution includes 0.1% to 10% by weight of iodine dissolved in a solvent. A higher concentration of said iodine results in an impairment of white light transmittance and/or adherence of the resultant thin layer of copper iodide 2. A lower concentration of said iodine requires a long time period for completing the reaction. An advantageous concentration of said iodine is 0.3% to 2% by weight.

It is possible to use any solvent which is inert to the substrate, a thin layer of copper metal, and the resultant thin layer of copper iodide. The operable solvents of the iodizing solution in accordance with the invention are various as follows:

(1) aromatic hydrocarbons such as benzene, toluene, xylene, ethyl benzene, diethyl benzene, tetralin, and Decalin.
(2) aliphatic hydrocarbons such as n-hexane, n-octane, isooctane, petroleum ether, petroleum benzine, ligroin, gasoline, kerosene, mineral spirit, and cyclohexane,
(3) halogenated hydrocarbons such as ethylene chloride, carbon tetrachloride, pentachloroethane, trichloroethylene, 1,2-dibromoethane, monochlorobenzene, bromobenzene, and fluorodichloroethane,
(4) ethers and acetals such as ethyl ether, sym-dichloroethyl ether, isopropyl ether, n-hexyl ether, furane, furfural, tetrahydrofuran, and tetrahydropyran,
(5) ketones such as acetone, methyl ethyl ketone, methyl isobutyl ketone, diethyl ketone, diacetone alcohol, cyclohexanone, and acetophenone,
(6) esters, such as ethyl formate, n-butyl formate, methyl acetate, ethyl acetate, n-propyl acetate, benzyl acetate, ethyl butylate, ethyl acetoacetate, methyl benzoate, and diethyl oxalate.

In order to promote the evaporation of said solvent after completion of the reaction, it is advantageous to employ a solvent having a boiling point of 50° C. to 150° C. In view of low cost, inflammability, high volatility and a high ability for dissolving iodine, in addition to improved transmittance and a high adherence of resultant thin layer of copper iodide, the most practical solvent is gasoline, kerosene, benzene, toluene, carbon tetrachloride, methyl ethyl ketone or a mixture thereof.

Said iodine-containing solution is prepared by adding the aforesaid weight percent of crystalline iodine to the aforesaid solvent and mixing well in a per se well known chemical technique. When the added amount of iodine is greater than that corresponding to the solubility in the solvent, excess iodine precipitates in the solution. The precipitated iodine is removed from the solution in per se well known manner. The solvent dissolves iodine in ionic form molecular form and/or in a form of charge transfer complex with solvent. The solution according to the present invention has an iodizing power for the copper layer regardless of the dissolved form of the iodine.

The surface resistivity of the thin layer of copper metal extends over a wide range, 1Ω to $10^{11}$Ω, as stated above with reference to FIG. 3. A thin layer of copper metal having a surface resistivity higher than $10^{10}$Ω is converted into a thin layer of copper iodide having the surface resistivity of $10^{11}$Ω to $10^{12}$Ω as shown by triangle marks of FIG. 3. When the thin layer of copper metal is converted to a layer of copper iodide in accordance with the present invention, the surface resistivity of thin layer of copper iodide converges to a narrow range of $5\times10^3$ to $10^6$Ω as shown by circle marks. Such a convergence of surface resistivity of a thin layer of copper iodide is very suitable for manufacture of films having surface resistivities in a close tolerance.

The white light transmittance is also improved by a conversion of copper metal into copper iodide. The thin layer of copper metal having white light transmittance of 10% to 70% is converted into a thin layer of copper iodide having white light transmittance of 80% to 95% in accordance with the invention.

According to the invention, a thin layer of copper metal having white light transmittance higher than 40% is converted into a thin layer of copper iodide which is superior in adherence to the substrate. In view of the superior adherence and the surface resistivity of the resultant thin layer of copper iodide, it is advantageous that said thin layer of copper metal has a white light transmittance ranging from 40% to 70%.

The adherence referred to herein is defined as follows. The surface of the thin layer of copper iodide superposed on the substrate is grooved in a grid form having 100 meshes per 1 cm.$^2$ by using a sharp blade. An adhesive tape is applied to the grooved surface and then peeled abruptly. The adherenece is evaluated by the number of meshes remaining on the substrate.

According to such an adherence test, it has been proved that an excellent adherence is obtained with the thin layer of copper iodide which is prepared by causing a thin layer of copper metal having white light transmittance higher than 40% to react wih an iodine-containing solution including 0.3% to 2% by weight of dissolved iodine in accordance with the invention.

It has been well-known that white light transmittance of thin layer of copper iodide is impaired by an increase in the grain size of the copper iodide. Therefore, it is desirable for achievement of a high white light transmittance that the grain size of copper iodide be as low as possible. Electron-microscopic observations indicate that the thin layer of copper iodide according to the present invention has an average grain size less than 0.02 micron.

Figure 2:
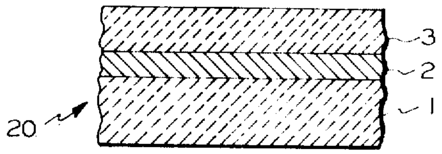
FIG. 2 is a cross-sectional view, on a highly exaggerated scale of a film having an electrically conducting thin layer of copper iodide adhered strongly to a substrate and a resinous topcoat superposed on said thin layer of copper iodide in accordance with the present invention.

A three-layered film 20 according to FIG. 2 is prepared by using an iodine-containing solution having resinous material dissolved therein in accordance with the invention. Any resinous material which dissolves in the iodine-containing solution and is substantially inert to the dissolved iodine and to the resultant thin layer of copper iodide can be used.

The advantageously employed resinous material is an adhesive material for an adhesive tape, a paint vehicle or a printing ink vehicle such as polyvinyl acetate, butadiene - acrylonitrile copolymer, vinychloride-vinylacetate copolymer, vinylidene chloride acrylonitrile copolymer, polymethylmethacrylate, boiled oil of unsaturated glyceride, alkyd resin, epoxy resin, polyurethane resin, and silicone resin. The concentration of said resinous material in said iodine-containing solution varies with the desired thickness of topcoat 3 of FIG. 2 and the viscosity of the resultant iodine-containing resinous solution, and preferably ranges from 0.1% to 30% by weight.

Aforesaid film having a thin layer of copper metal is caused to react with the iodine-containing solution having said resinous material therein in the manner herein before set forth.

After completion of the reaction, the resultant film is dried in a suitable and per se conventional method. After drying a three-layered film 20 according to FIG. 3 is formed.

When said resinous material is a heat-sensitive resin such as a polyester resin as described in U.S. Pat. 3,118,785, or a copolymer of butyl methacrylate and styrene described in U.S. Pat. 3,118,787 for use in "Thermoplastic Recording Medium," the three-layered film 20 can serve as a "Thermoplastic Recording Film."

Another application of the three-layered film 20 is a flexible and transparent electrophotographic film, an example of which is described in U.S. Pat. 3,168,857. In this case, the iodine-containing solution generally consists of at least four components, i.e. a solvent, dissolved iodine, a dissolved organic photoconductive substance, and a dissolved binder resin. The use of such solution produces a three layered film 20 having a top layer 3 consisting of the organic photoconductive substance bonded together by said binder resin. When the organic photoconductive substance is a film-forming polymer, the binder resin member is not necessarily used.

When the photoconductive substance in topcoat 3 is sensitized by iodine, a part of the iodine in the iodine-containing solution can serve as a photosensitizer for an organic photoconductive substance dissolved therein. For example, as set forth in German Pat. 1,068,115, a polymeric photoconductive substance, poly-N-vinyl carbazole, forms a weak charge transfer complex with iodine to promote the photosensitivity thereof.

Figure 4:
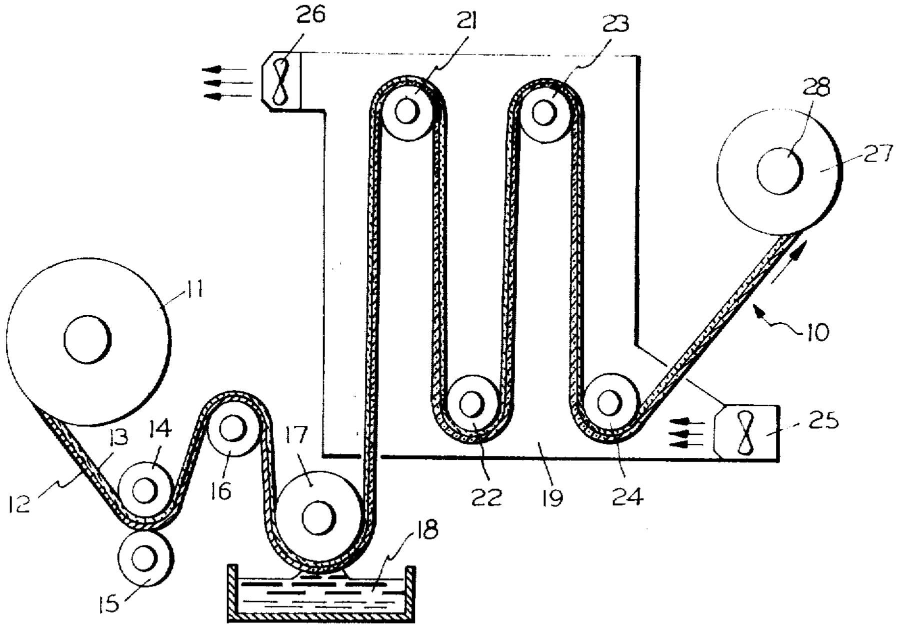
FIG. 4 is a schematic illustration of an apparatus suitable for making successively a long film according to FIG. 1 and FIG. 2.

A long-rolled web of a film 10 of FIG. 1 can be manufactured by using an apparatus as schematically illustrated by FIG. 4. A long rolled web of a flexible substrate such as cellulose acetate, polyethylene terephalate or polyvinylchloride is provided, at one surface, with the aforesaid thin layer of copper metal by a continuous vacuum evaporation method in accordance with the per se well known art technique. A rolled web 11 of substrate 13 having said thin layer of copper metal 12 is unwound by a couple consisting of a driving roll 14 and a pressure roll 15 and is fed to an iodine-containing solution 18 via guide roll 16.

A backing roll 17 located over said idoine-containing solution 18 causes said thin layer of copper metal to be coated with said iodine-containing solution. Said thin layer of copper metal starts to be converted into a thin layer of copper iodide to form a film 10 according to FIG. 1 upon contact of said thin layer of copper metal with said solution. Then the still-wet film is dried during travel over guide rollers 21, 22, 23 and 24 in a drying chamber 19 which has hot air ventilated from inlet 25 to outlet 26. The conversion of the thin layer of copper iodide is almost completed prior to the guide roller 21. The dried film 10 is wound around a reel 27 located at the outside of said drying chamber 19. Said reel 27 is mounted on a driving shaft 28.

The weight percent of iodine in said solution 18 depends on the thickness of the thin layer of copper metal 12 and the thickness of said solution adherent to said thin layer of copper metal, which is dependent on the traveling speed of the film, and the viscosity and surface tension of said solution 18.

Figure 5:
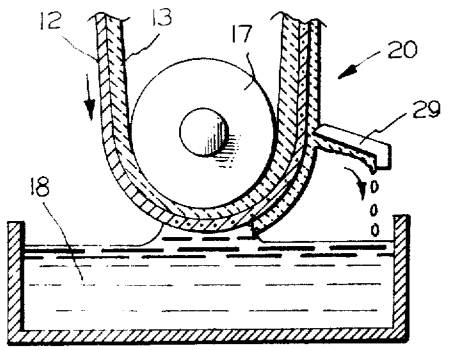
FIG. 5 is a schematic illustration of a variation in the coating device of FIG. 4.

A long-rolled web of the film 20 according to FIG. 2 can be prepared in a manner similar to that for the film 10. In the manufacturing process for film 20, the solution 18 consists of at least three components, i.e. a solvent, iodine and a resinous material in accordance with the foregoing description. When the solution 18 is highly viscous, the thickness of the coating of iodine containing solution is advantageously controlled by using a knife blade 29 as shown in FIG. 5.

Illustrative embodiments of the invention are as follows:

EXAMPLE 1

Film substrates of polyethylene terephthalate commercially available as "Lumirror," having a thickness of 75 microns and an area of 5 cm. x 5 cm. were placed in a bell type jar of a vacuum evaporation apparatus. The films were spaced about 40 cm. from a tungsten heater which held 5 g. of electrolytic copper chips of 99.99% purity. After evacuation to $3\times10^{-5}$ mm. Hg, said tungsten heater was heated to evaporate the copper metal. The deposition amount of copper metal was controlled by controlling the exposing time of the substrate to the copper vapor. The substrates were always kept at 42° C. or below. The white light transmittances of the obtained thin layers of copper metal are shown by open circles and triangles in FIG. 3.

Said films having copper layer in various thickness were then immersed, at room temperature, in a solution which consisted of 1.5 g. of iodine dissolved in 100 g. of benzene. The thin layer of copper metal discolored in about 20 seconds even when the copper layer had a white light transmittance of 10% or less. The films having a thin layer of copper iodide of various thicknesses were pulled up from the solution and dried with a flowing hot air of 70° C. so as to volatilize the residual iodine and benzene. The data of the resultant copper iodide layers are shown by dot-containing circles and triangles in FIG. 3.

By the aforesaid method of the adhesive tape test, the copper iodide layers which were prepared with copper layer having white light transmittances less than 40% showed adherence of lower than 100 in the adhesive tape test, the adhesive tape used being a commercially available "Scotch Tape No. 56."

For the purpose of an electrode of aforesaid "Thermoplastic Recording Film," an electrophotographic film and a photoplastic recording film, the inventors found that the surface resistivity of copper iodide should be lower than $10^9\Omega$, more advantageously lower than $10^7\Omega$, and the adherence should be 100 in the adhesive tape test. Therefore the suitable copper iodide layers for the aforesaid purpose were found to be those converted from copper metal layer having white light transmittances of 40% to 70% as shown in FIG. 3. From the electron-microscopic observations, all surfaces of said copper iodide layers were found to be less than 0.02 micron in average grain size.

EXAMPLE 2

Film substrates of polyethylene terephthalate having thin layers of copper metal of various thickness, i.e. 18%, 38%, 42%, 54%, and 65% in white light transmittance were obtained by the vacuum evaporation of copper metal in the manner described in Example 1. Then the films were immersed into a solution which consisted of 1.5 g. of dissolved iodine and 100 g. of carbon tetrachloride. The iodization reaction was completed in about 15 seconds even in the case of the thicker layer of 54% in white light transmittance. After iodization the residual iodine and solvent were removed by applying flowing hot air at 70° C.

The resultant copper iodide layers showed surface resistivities of $8\times10^3\Omega$, $2\times10^4\Omega$, $6\times10^4\Omega$, $3\times10^5\Omega$, and $8\times10^5\Omega$, and white light transmittances of 81%, 83%, 87%, 90%, and 92% and the adherences of 84, 95, 100, 100, and 100 in the adhesive tape test respectively. From the electron-microscopic observations, five surfaces of said copper iodide layers were found to be less than 0.02 micron in average grain size.

EXAMPLE 3

A commercially available transparent cellulose triacetate film of a thickness of 150 microns was exposed to copper vapor so as to form a thin layer of copper metal having a white light transmittance of 68%. Then the film having said thin layer of copper metal was immersed, at room temperature, into a solution which consisted of 0.5 g. of dissolved iodine and 100 g. of kerosene. The resultant copper iodide layer on the cellulose triacetate substrate showed a surface resistivity of $6\times10^5\Omega$, a white light transmittance of 95% and an adherence to the substrate of 100 in the adhesive tape test. The transparency of the resultant two-layered film was 88% in white light transmittance. The grain size of the surface of said copper iodide was less than 0.02 micron in the electron-microscopic observation.

EXAMPLE 4

A substrate of 75 microns thick polyethylene terephthalate film having a thin layer of copper metal obtained in the similar manner as those of Example 1, wherein the thin layer of copper metal had a white light transmittance of 68%, was immersed at room temperature into a solution which consisted of 0.3 g. of dissolved iodine and 100 g. of toluene. The iodization reaction was completed in about 20 seconds. The residual iodine and solvent were volatilized with flowing hot air. The resultant copper iodide layer showed a surface resistivity of $5\times10^5\Omega$, a white light transmittance of 91%, and an adherence to the substrate of 100 in the adhesive tape test. The grain size of the surface of said copper iodide was less than 0.02 micron in the electron-miscroscopic observation.

EXAMPLE 5

A rolled film of polyethylene terephthalate having a thickness of 75 microns was continuously unwound and exposed to copper vapor and then rewound in a vacuum chamber of $5\times10^{-5}$ mm. Hg. The film surface was always kept at 40° C. or below. The rolled film having a thin layer of copper metal which showed a white light transmittance of 58 to 62% was then charged to an apparatus as shown in FIG. 4 under atmospheric conditions. The film 11 was unwound and iodized at room temperature with an iodine-containing solution by bead coating as shown in FIG. 4. The solution contained 1 g. of iodine in 100 g. of carbon tetrachloride. The film traveling speed was 1 m./min. The solution attached to the copper surface completely decolorized the copper color when the film passed the guide roller 21.

Hot air at 80° C. in drying chamber 19 causes the residual iodine and solvent to evaporate off completely before the film passed guide roller 24. The resultant two-layered film 10 shown in FIG. 1 was rewound tightly around the driving shaft 28. The copper iodide layer of said resultant two-layered film showed a surface resistivity range of $3\times10^4\Omega$ to $8\times10^4\Omega$ and a white light transmittance more than 90%. The adherence of the copper iodide layer to the substrate was excellent i.e. 100 in adhesive tape test. The grain size of the surface of said copper iodide was less than 0.02 micron in the electron-microscopic observation.

EXAMPLE 6

A transparent substrate of polyvinyl chloride film commercially available as "Kurephane," having a thickness of 50 microns was coated with copper metal by the vacuum evaporation method as described in Example 1. The thin layer of copper metal showed 65% in white light transmittance. The copper surface of the film was then coated at room temperature with a viscous solution which consisted of four components, i.e. 1.5 g. of dissolved iodine, 15 g. of polyvinyl acetate having an average polymerization grade of 4200, 20 g. of methyl ethyl ketone and 90 g. of toluene. The coating method for said solution was a knife method. After being coated with said solution, the thin layer of copper metal was converted into a thin layer of copper iodide. Then the film was dried by applying flowing hot air at 90° C. for about 40 seconds.

The resultant three-layered film consisted of, from the bottom up, polyvinyl chloride substrate, thin layer of copper iodide and polyvinyl acetate topcoat and showed a white light transmittance of 88% and a thickness of 55 microns. The thin layer of copper iodide was measured to have a surface resistivity of $2\times10^5\Omega$ by removing said topcoat with toluene.

EXAMPLE 7

A rolled web of polyethylene terephthalate substrate having a thin layer of copper metal was obtained in the manner described in Example 5. Said thin layer of copper metal had a range of white light transmittance of 58% to 62%. The thin layer of copper metal was iodized at room temperature with a viscous solution consisting of four components, i.e., 1.5 g. of dissolved iodine, 10 g. of vinyl chloride vinyl acetate copolymer, commercially available as VAGH, 30 g. of methyl ethyl ketone and 80 g. of toluene in a manner essentially similar to that shown in FIG. 4. However, the coating method for said solution was carried out in a manner shown schematically in FIG. 5. Said viscous solution 18 attached to the surface of thin layer of copper metal 12 was metered in thickness with a knife blade 30 and the coating was dried with ventilated hot air at 80° C. so as to form a transparent three-layered film. The traveling speed of the film in the apparatus was 2 m./min. The thickness of the dried topcoat was about 4 microns. The transparent topcoat well covered the middle layer of copper iodide. The white light transmittance of the resultant three-layered film was 87% and the adherence in the two interfaces was excellent, i.e. 100 in the adhesive tape test.

EXAMPLE 8

A rolled web of polyethylene terephthalate substrate was coated with a thin layer of copper metal in the manner described in Example 5. The rolled web having the thin layer of copper metal was then charged in an apparatus as shown in FIG. 4 and the thin layer of copper metal was iodized at room temperature with a solution which consisted of the following:

| | Parts by wt. |
|---|---|
| Iodine | [1] 3 |
| Poly-N-vinylcarbazole ("Luvican M-170") | [2] 100 |
| Diphenyl chloride ("Kanechlor 400") | [3] 50 |
| Rhodamin 6G | [4] 0.04 |
| 2-methyl anthraquinone | [4] 10 |
| Toluene | [5] 700 |

[1] Iodizing agent and sensitizer.
[2] Photoconductive matrix.
[3] Plasticizer for poly-N-vinylcarbazole.
[4] Sensitizer.
[5] Solvent.

The coating technique of the above solution was essentially similar to that described in Example 6 or 7. The dried topcoat consisted of substantially transparent solid solution of poly-N-vinylcarbazole, diphenyl chloride, Rhodamin 6G, 2-methyl anthraquinone and a trace of iodine and was about 13 microns in thickness. The resultant three-layered film showed a white light transmittance of 70% and was successfully used as an electrophotographic image recording film.

EXAMPLE 9

A rolled web of a film substrate of polyethylene terephthalate having a thin layer of copper metal, which was obtained in the manner described in Example 5, was charged in an apparatus as shown in FIG. 4 and the thin layer of copper metal was iodized at room temperature with a solution which consisted of:

| | Parts by wt. |
|---|---|
| Iodine | 1 |
| Styrene-methyl methacrylate-butadiene 1,3-copolymer (see Example 1 of U.S. Pat. 3,118,787) | 30 |
| Benzene | 100 |

The techniques for coating and drying of above solution were essentially similar to that described in Example 8. The dried topcoat consisted of a transparent film of the styrene-methyl methacrylate-butadiene 1,3-copolymer, and was 8 microns in thickness. The resultant three layered film was successfully used as aforesaid "Thermoplastic Recording Film."

EXAMPLE 10

A thin layer of copper metal was provided on a transparent substrate of 75 microns thick polyethylene terephthalate in the manner described in Example 1. The white light transmittance of said thin layer of copper metal was 49%. The surface of said thin layer of copper metal was coated with a solution consisting of:

| | Parts by wt. |
|---|---|
| Iodine | [1] 2 |
| Styrene-butadiene copolymer ("Pliolite S-5B") | [2] 50 |
| Bis-(4,4'-dimethyl-aminophenyl) phenyl methane | [3] 25 |
| Methyl ethyl ketone | [4] 300 |

[1] Iodizing agent.
[2] Thermoplastic binder member.
[3] Photoconductive substance.
[4] Solvent.

The coating technique of above solution was essentially similar to that described in Example 8. The dried topcoat consisted of a solid solution of said styrene-butadiene copolymer and bis(4-,4'-dimethyl-aminophenyl) phenyl methane. The thickness of the topcoat was about 3 microns. The softening point of the top coat was about 55° C.

The resultant three-layered film having a white light transmittance of 75% was successfully used as an electrophotographic image recording film and the photoplastic recording film aforementioned.

What is claimed is:

1. A method for making a long rolled web of substantially flexible and transparent three-layered film, comdising, as the bottom layer, a substantially flexible and transparent inert polymer substrate; as the intermediate layer a substantially flexible and transparent electrically conductive layer, and as the top layer a substantially flexible and transparent topcoat of a resinous material, said three-layered film being produced by a method which comprises the steps of (1) unwinding a roll of said substrate in a vacuum chamber;

(2) vapor depositing copper metal onto the surface of said substrate which is maintained at substantially room temperature to produce a layer of copper metal on said surface, wherein the thickness of said layer of copper metal is characterized by a white light transmittance of 40% to 70%;

(3) rewinding said substrate having said layer of copper metal in said vacuum chamber to form a rolled web;

(4) unwinding the roll of said substrate having said layer of copper metal under atmospheric conditions;

(5) continuously applying a solution consisting essentially of iodine in an organic solvent selected from the group consisting of aromatic, aliphatic and halogenated hydrocarbons, ethers, esters, acetals and ketones, and 0.1 to 30% by weight of a resinous material to the surface of said layer of copper metal so as to produce a layer of a substantially transparent and electrically conductive copper iodide having a sesinous layer superimposed thereon;

(6) continuously applying hot air to said solution coated surface so as to remove both said organic solvent and iodine, and (7) rewinding the resultant three-layered film in the shape of a rolled web.

2. A method for making two-layered film of substantially transparent coating on a surface of a solid inert insulating substrate, which comprises exposes said surface to an atmosphere of copper metal vapor so as to form a layer of copper metal on said surface, said layer of copper metal being characterized by a white transmittance of 40% to 70%, and contacting said layer of copper metal with a solution which consists essentially of iodine and a resinous material in an organic solvent selected from the group consisting of aromatic, aliphatic and halogenated hydrocarbons, ethers, esters, acetals and ketones, said iodine and said resinous material being included in said solution in an amount of 0.1 to 1.0 weight percent and 0.1 to 30 weight percent to said solution, respectively, whereby during said layer of copper metal being contacted with said iodine-containing solution, said layer of copper metal is iodized to form a copper iodide of substantially transparent coating and is simultaneously coated with said resinous material on said copper iodide coating.

3. A method for making a two-layered film of a substantially transparent coating on a surface of a solid inert insulating substrate, as defined in claim 2, wherein said iodine-containing resinous solution contains at least one plastic heat-deformable resin.

4. A method for making a two-layered film of a substantially transparent coating on a surface of a solid inert insulating substrate as defined in claim 2, wherein said iodine-containing resinous solution contains at least one organic photoconductive insulating substance.

5. A method for making a two-layered film of a substantially transparent coating on a surface of a solid inert insulating substrate as defined in claim 2, wherein said iodine-containing resinous solution contains at least one organic insulating substance having thermoplasticity and photoconductivity.

References Cited

UNITED STATES PATENTS

| | | | |
|---|---|---|---|
| 2,756,165 | 7/1956 | Lyon | 117—211 |
| 3,113,179 | 12/1963 | Glenn, Jr. | 117—218 UX |
| 3,201,275 | 8/1965 | Herrick | 117—218 X |
| 3,244,544 | 4/1966 | Scharf | 117—62 X |
| 3,308,444 | 3/1967 | Ting | 96—1.1 |
| 3,505,131 | 4/1970 | Wells | 117—217 X |

ALFRED L. LEAVITT, Primary Examiner
C. K. WEIFFENBACH, Assistant Examiner

U.S. Cl. X.R.

117—62, 107, 215, 218